(12) United States Patent
Yue et al.

(10) Patent No.: US 7,851,860 B2
(45) Date of Patent: Dec. 14, 2010

(54) TECHNIQUES TO REDUCE SUBSTRATE CROSS TALK ON MIXED SIGNAL AND RF CIRCUIT DESIGN

(75) Inventors: Cheisan J. Yue, Roseville, MN (US); James D. Seefeldt, Eden Prairie, WI (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/811,207

(22) Filed: Mar. 26, 2004

(65) Prior Publication Data

US 2005/0212071 A1  Sep. 29, 2005

(51) Int. Cl.
*H01L 29/786* (2006.01)
(52) U.S. Cl. .............................. 257/349; 257/E21.564
(58) Field of Classification Search ................. 257/127, 257/170, 339, 409, 372–376, 394–400, 452, 257/484, 490, 605, 500–510, 349, E21.564
See application file for complete search history.

(56) References Cited

U.S. PATENT DOCUMENTS

| | | | | |
|---|---|---|---|---|
| 4,819,052 A | * | 4/1989 | Hutter | 257/378 |
| 5,264,387 A | * | 11/1993 | Beyer et al. | 438/404 |
| 5,661,329 A | * | 8/1997 | Hiramoto et al. | 257/510 |
| 5,889,314 A | | 3/1999 | Hirabayashi | |
| 6,104,054 A | | 8/2000 | Corsi et al. | |
| 6,355,537 B1 | | 3/2002 | Seefeldt | |
| 6,429,502 B1 | | 8/2002 | Librizzi et al. | |
| 6,521,947 B1 | * | 2/2003 | Ajmera et al. | 257/347 |
| 6,573,565 B2 | * | 6/2003 | Clevenger et al. | 257/355 |
| 6,645,796 B2 | * | 11/2003 | Christensen et al. | 438/149 |
| 2003/0085432 A1 | | 5/2003 | Du et al. | |

FOREIGN PATENT DOCUMENTS

JP  2-271567  * 6/1990

OTHER PUBLICATIONS

Japanese Abstract, Publication No. 02271567, Publication Date Jun. 11, 1990.
European Examination Report from corresponding EP Application No. 05726078, mailed May 12, 2010, 3 pages.

* cited by examiner

*Primary Examiner*—Bradley K Smith
*Assistant Examiner*—Amar Movva
(74) *Attorney, Agent, or Firm*—Shumaker & Sieffert, P.A.

(57) ABSTRACT

An integrated circuit has a buried insulation layer formed over a semiconductor substrate, and a semiconductor mesa formed over the buried insulation layer. A low resistivity guard ring substantially surrounds the semiconductor mesa and is in contact with the semiconductor substrate. The low resistivity guard ring is grounded and isolates the semiconductor mesa from RF signals.

21 Claims, 2 Drawing Sheets

TECHNIQUES TO REDUCE SUBSTRATE CROSS TALK ON MIXED SIGNAL AND RF CIRCUIT DESIGN

TECHNICAL FIELD OF THE INVENTION

The present invention relates to RF isolation in integrated circuits.

BACKGROUND OF THE INVENTION

It is well known that the general trend in semiconductor integrated circuit fabrication is to produce smaller and smaller devices so that more circuitry can be packed into less wafer real estate. This trend means that the spacing between devices of an integrated circuit shrinks. As the spacing between devices shrinks, adjacent devices increasingly interact with each other, reducing performance of the integrated circuit.

The basic measurement parameter that characterizes this interaction effect is called electrical isolation. If high electrical isolation, and in particular, high RF isolation, between devices of an integrated circuit can be achieved, those devices can be spaced more closely together. As a result, the die size of the integrated circuit can be minimized. Minimum size, in turn, implies smaller packaging and, thus, less space used on the application PCB Board. Also, since wafer processing costs are nearly independent of the chip size, smaller circuits imply more die per wafer and thus a lower cost per die.

Isolation is particularly important for analog integrated circuits and for analog/digital mixed integrated circuits such as those used in wireless and wireline communications applications. In general, wireless communication devices use high-frequency signals such as 900 MHz to 1900 MHz for cellular phones, and higher frequencies (up to 6 GHz or more) for other applications such as wireless LANs and fiber optic transceivers.

RF signals at such frequencies are difficult to generate and control. These signals also have a tendency to interfere with one other because they are easily coupled by parasitic properties present in all electronic components, including integrated circuits. Such undesirable parasitic effects result, for example, from the conductive silicon substrates on which integrated circuits are fabricated. Poor electrical isolation in a receiver can lead to a local oscillator signal appearing at the output of the receiver and being effectively transmitted at the antenna. Wireless regulatory authorities limit the amount of spurious signals that can be radiated by the receiver, and limiting the amount of local oscillator radiation is important in meeting these limits.

$SiO_2$ trench isolation and conductive guard rings are isolation techniques that have been employed (such as with SOI processes) to isolate devices of an integrated circuit. Dielectric trench isolation structures provide lateral barriers between circuit devices. Conductive guard rings are used to enclose the area to be isolated. Both techniques isolate signals and minimize the undesired coupling that would otherwise limit performance for closely spaced adjacent circuit devices.

U.S. Pat. No. 6,355,537 discloses a double ring approach where two isolation trenches (usually rectilinear) are formed around a device to be isolated. The silicon between the two isolation trenches is doped to form a conductive guard ring region, and a grounded contact is applied to the conductive guard ring region. The isolation trenches may be filled with a dielectric such as silicon oxide or oxide/polysilicon. This grounded guard ring region, the use of SOI on which the integrated circuit is formed, and the use of a high resistivity material for the substrate of the SOI greatly improves RF isolation.

However, the process disclosed in the '537 patent is primarily for thick SOI where the epitaxial layer is on the order of one micron. Moreover, the process disclosed in the '537 patent relies on an $n^+$ buried layer that forms a low resistivity RF signal path. Also, the process disclosed in the '537 patent is BiCMOS (bipolar CMOS) dependent.

U.S. Pat. No. 5,661,329 discloses the use of a separation groove around active regions of an integrated circuit. One disadvantage of this separation groove is that external RF power can still pass through the separation groove to the active region. Moreover, this separation groove appears to be intended primarily for yield improvement and not for RF isolation. Therefore, the '329 patent does not appear to address the problem of RF isolation and appears to show no intent to terminate electric fields created by RF power.

SUMMARY OF THE INVENTION

According to one aspect of the present invention, an integrated circuit comprises a semiconductor substrate, a buried insulation layer over the semiconductor substrate, a semiconductor mesa over the buried insulation layer, and a guard ring substantially surrounding the semiconductor mesa. The guard ring is in contact with the semiconductor substrate, and the guard ring is arranged to provide RF isolation for the semiconductor mesa.

According to another aspect of the present invention, an integrated circuit comprises a semiconductor substrate, a buried insulation layer over the semiconductor substrate, a first semiconductor mesa over the buried insulation layer, a second semiconductor mesa over the buried insulation layer, a first guard ring substantially surrounding the first semiconductor mesa, and a second guard ring substantially surrounding the second semiconductor mesa. The first guard ring is in contact with the semiconductor substrate, and the first guard ring is arranged to provide RF isolation for the first semiconductor mesa. The second guard ring is in contact with the semiconductor substrate, and the second guard ring is arranged to provide RF isolation for the second semiconductor mesa.

According to still another aspect of the present invention, a method of isolating a semiconductor feature of an integrated circuit from RF signals comprises the following: forming a buried insulation layer over a semiconductor substrate; forming a semiconductor feature in one or more semiconductor layers so that the semiconductor feature is formed over a portion of the buried insulation layer, wherein the buried insulating layer has a trench therethrough down to the semiconductor substrate that substantially encloses the portion of the buried insulation layer, wherein the one or more semiconductor layers has a trench therethrough that substantially encloses the semiconductor feature, and wherein the trench through the one or more semiconductor layers substantially aligns with the trench through the buried insulating layer; and, filling the trench through the one or more semiconductor layers and the trench through the buried insulating layer with conducting material having low resistivity so that a conductive guard ring substantially surrounds the semiconductor feature.

According to yet another aspect of the present invention, an integrated circuit comprises a semiconductor substrate, a semiconductor feature, and a guard ring. The semiconductor substrate forms a first semiconductor layer. The semiconductor feature is formed in a second semiconductor layer, and the second semiconductor layer is over the first semiconductor layer. The guard ring substantially surrounds the semiconductor feature, the guard ring is in contact with the semiconductor substrate, and the guard ring is arranged to provide RF isolation for the semiconductor feature.

BRIEF DESCRIPTION OF THE DRAWINGS

These and other features and advantages of the present invention will become more apparent from a detailed consideration of the invention when taken in conjunction with the drawings in which.

DETAILED DESCRIPTION OF THE INVENTION

Figure 1:
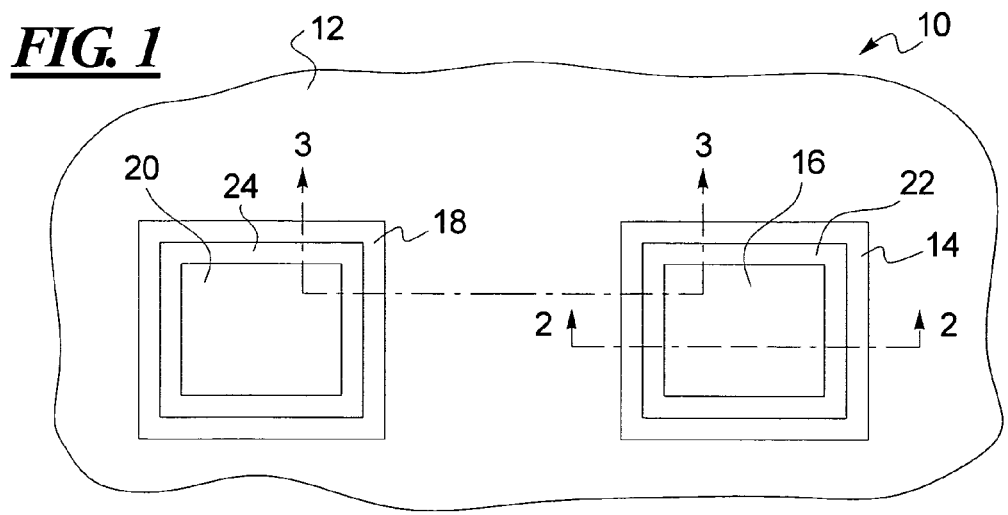
FIG. 1 is a top plan view illustrating a semiconductor integrated circuit in accordance with the present invention.

As shown in FIG. 1, a semiconductor integrated circuit 10 in accordance with one embodiment of the present invention includes a single SOI substrate 12. The SOI substrate 12 typically includes a silicon handle wafer, a buried oxide layer over the silicon handle wafer, and one or more silicon layers that are over the buried oxide layer and that are processed to form electronic devices of the integrated circuit. However, the present invention can be applied to non-SOI substrates, such as bulk silicon, and to other SOI substrates, such as SOS (silicon-on-sapphire) substrates.

The SOI substrate 12 includes a first isolation guard ring 14 that isolates a first device mesa 16 and a second isolation guard ring 18 that isolates a second device mesa 20. In addition, an optional first dielectric ring 22 may be provided between the first isolation guard ring 14 and the first device mesa 16, and an optional second dielectric ring 24 may be provided between the second isolation guard ring 18 and the second device mesa 20. The dielectric in the first and second dielectric rings 22 and 24 may be silicon oxide or some other material, such as, for example, oxide/silicon nitride.

The first and second device mesas 16 and 20 may each comprise many different types of devices such as, for example, one or more transistors, and/or one or more diodes, and/or one or more capacitors, and/or one or more resistors, etc. Thus, any type of semiconductor element or elements may be formed in each of the first and second device mesas 16 and 20. Each of the first and second device mesas 16 and 20 may comprise one, two, or more such elements forming a single element or a sub-circuit. The semiconductor element or elements may be active, passive, or a combination of both. Furthermore, any number of devices, device mesas, and isolation guard rings may be included on the SOI substrate 12.

Figure 2:
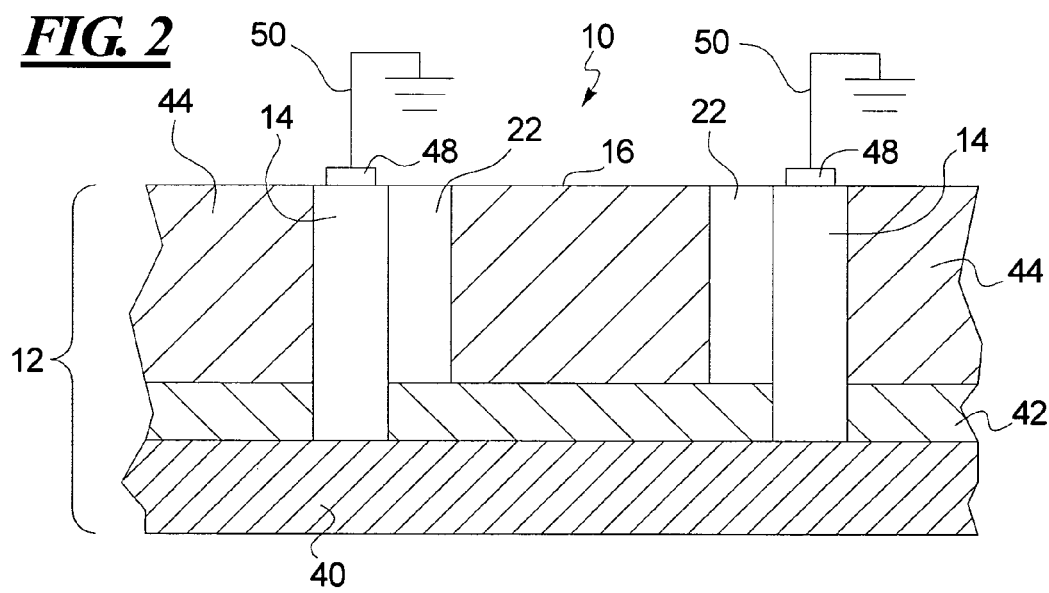
FIG. 2 is a sectional view illustrating the semiconductor integrated circuit of FIG. 1 taken along line 2-2.

As shown in FIG. 2, the SOI substrate 12 includes a silicon handle wafer 40 and a buried insulating layer 42 that separates the first device mesa 16 from the silicon handle wafer 40. By way of example, the silicon handle wafer 40 may be formed of p− single crystal silicon, and the buried insulating layer 42 may be formed of a silicon oxide film. The silicon handle wafer 40 is preferably a high resistivity (or high Z) substrate having a high ohm per centimeter rating such as, for example, 1 KΩ per centimeter. While a 1 KΩ per centimeter substrate performs very well, substrates having other resistivities (or Z) such as 18Ω per centimeter or above can be used.

The first isolation guard ring 14 surrounds the first device mesa 16. During formation of the first isolation guard ring 14, all of the layers (including any shallow trench isolation oxide) above the buried insulation layer 42 and the buried insulation layer 42 are selectively removed so as to form a trench that will be processed as described below in order to fabricate the first isolation guard ring 14.

The portion of the silicon handle wafer 40 that is exposed by the trench may be doped, such as by ion implantation. This doping improves to the ohmic contact between the first isolation guard ring 14 and the silicon handle wafer 40. The trench is filled with a low resistivity material to form the first isolation guard ring 14. The low resistivity material, for example, may be a conductive metal such as tungsten, aluminum, or copper. However, conductive materials other than metals can be used for the low resistivity material. An exemplary resistivity of such a low resistivity material is $5 \times 10^{-3}$ Ohm-cm.

As shown in FIG. 2, the first dielectric ring 22 may be formed down to the buried insulation layer 42.

The first isolation guard ring 14 surrounds the first device mesa 16, and the first isolation guard ring 14 also isolates the first device mesa 16 from a surrounding field $n^-$ layer 44. One or more metal contacts 48 are applied to first isolation guard ring 14 to provide a low resistance RF ground along one or more corresponding conductors 50. The one or more conductors 50 may be coupled to local ground through on-chip metal or, for better isolation, to an off-chip ground.

Accordingly, the first isolation guard ring 14 forms a low resistivity RF path to a metal layer which is connected to ground potential level.

Figure 3:
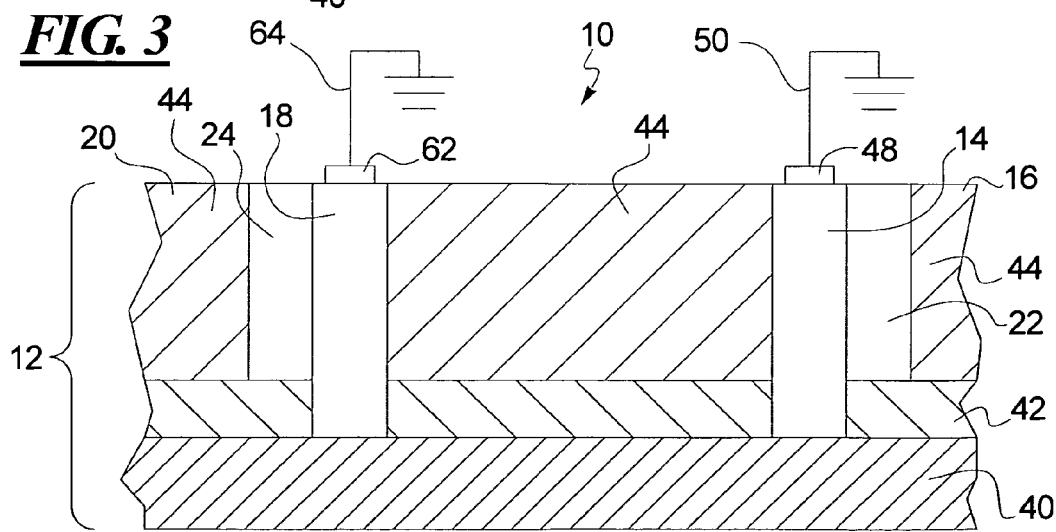
FIG. 3 is a sectional view illustrating the semiconductor integrated circuit of FIG. 1 taken along line 3-3.

As shown in FIGS. 1 and 3, the second isolation guard ring 18 surrounds the second device mesa 20. The second isolation guard ring 18 also contacts the silicon handle wafer 40, and the silicon handle wafer 40 may be doped where it contacts the second isolation guard ring 18 so as to improve the ohmic contact between the second isolation guard ring 18 and the silicon handle wafer 40.

One or more metal contacts 62 are applied to the second isolation guard ring 18 to provide a low resistance RF ground along one or more corresponding conductors 64.

The first and second isolation guard rings 14 and 18 provide excellent RF isolation because electric fields created by RF power are terminated to ground through the first and second isolation guard rings 14 and 18 and the conductors 50 and 64. Having these RF grounded terminations around the first and second device mesas 16 and 20 greatly improves RF isolation. Also, the use of the buried insulating layer 42 of the SOI substrate 12 provides additional RF isolation, and the use of the high resistivity (or high Z) silicon handle wafer 40 of the SOI substrate 12 improves RF isolation by making the silicon handle wafer 40 a high resistance path for RF power. Any leaking RF power will prefer the path of least resistance which will not be the silicon handle wafer 40 if a high Z substrate is used therefor.

Furthermore, the present invention means that thin SOI can be used for advanced mixed (analog and digital) signal/RF CMOS technology. For example, the n-type layer 44 may be on the order of 0.16 micron instead of the 1 micron layer that is used in BiCMOS. Also, as shown in FIGS. 2 and 3, the buried insulation layer 42 is completely removed in the trenches within which the first and second isolation guard rings 14 and 18 are formed to allow direct contact of the first and second isolation guard rings 14 and 18 to the silicon handle wafer 40 thus resulting in better RF isolation. Additionally, the material used to contact the silicon handle wafer 40 has a significantly lower resistivity than in prior devices resulting in better RF isolation. However, it should be noted that the present invention is not limited to the use of metals in the formation of the first and second isolation guard rings 14 and 18. Instead, in-situ doped low resistivity material/SEG (Selective Epitaxial Growth) can also be used to fill the trenches during formation of the first and second isolation guard rings 14 and 18.

Figure 4:
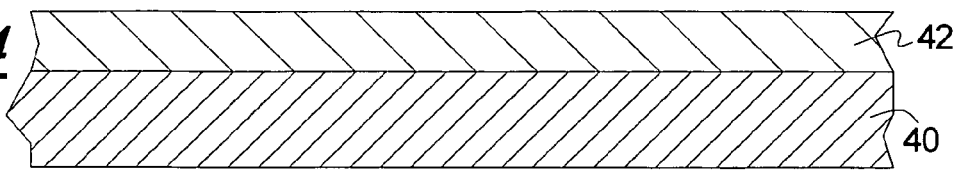
FIGS. 4-6 are sectional views illustrating a method of manufacturing the semiconductor integrated circuit as shown in FIG. 2; and, FIG. 7 is a top view of an exemplary layout of an integrated circuit incorporating the present invention.
Figure 5:
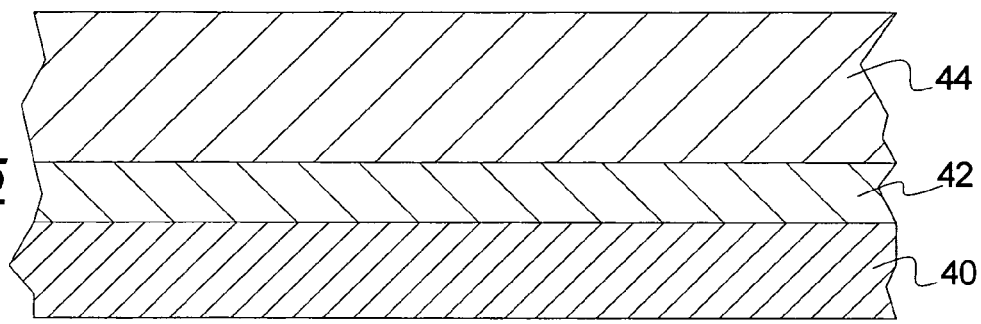
Figure 6:
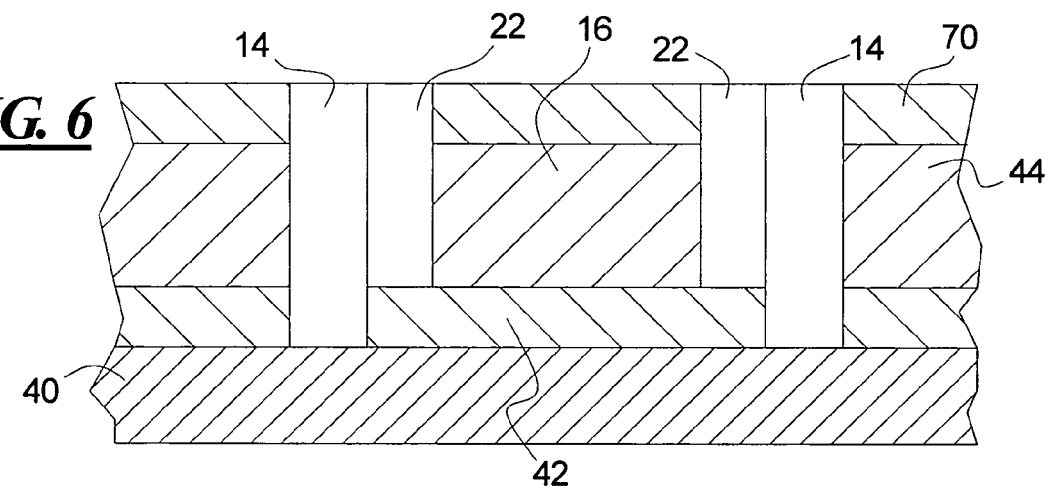

The process for manufacturing the semiconductor integrated circuit 10 is shown in more detail in connection with FIGS. 4 to 6. As shown in FIG. 4, the silicon handle wafer 40 is prepared by forming the buried insulating layer 42 over its main surface. The buried insulating layer 42 may be formed, for example, by high energy high dose ion implantation of oxygen into the silicon handle wafer 40. Alternatively, the buried insulating layer 42 may be formed, for example, by using a bonded wafer process.

As shown in FIG. 5, the n⁻ layer 44 is grown by epitaxial growth over the surface of the buried insulating layer 42. As shown in FIG. 6, the trenches for the first isolation guard ring 14 and the first dielectric ring 22 are formed by anisotropic etching, such as, for example, by RIE. Specifically, the trench for the first isolation guard ring 14 extends from the main surface of the n⁻ layer 44 to the silicon handle wafer 40. The trench for the first dielectric ring Z2 extends from the main surface of the n⁻ layer 44 to the buried insulating layer 42. A photoresist 70 may be used as a mask for the etching. Alternatively, a hard mask may be used as a mask for the etching in place of the photoresist 70.

After the photoresist 70 is removed, the trench for the first isolation guard ring 14 is filled with a conductive material such as, for example, metal, and the trench for the first dielectric ring 22 is filled with an insulator such as, for example, a silicon oxide. This insulator may be formed, for example, by depositing a silicon oxide film over the main surface of the n⁻ layer 44 by the CVD method and by etching back the silicon oxide film. The silicon oxide film may be over-etched off except from the inside of the trench that is used to form the first dielectric ring 22. The trench that is used to form the first dielectric ring 22 could alternatively be filled with other materials, such as, for example, oxide/silicon nitride.

Figure 7:
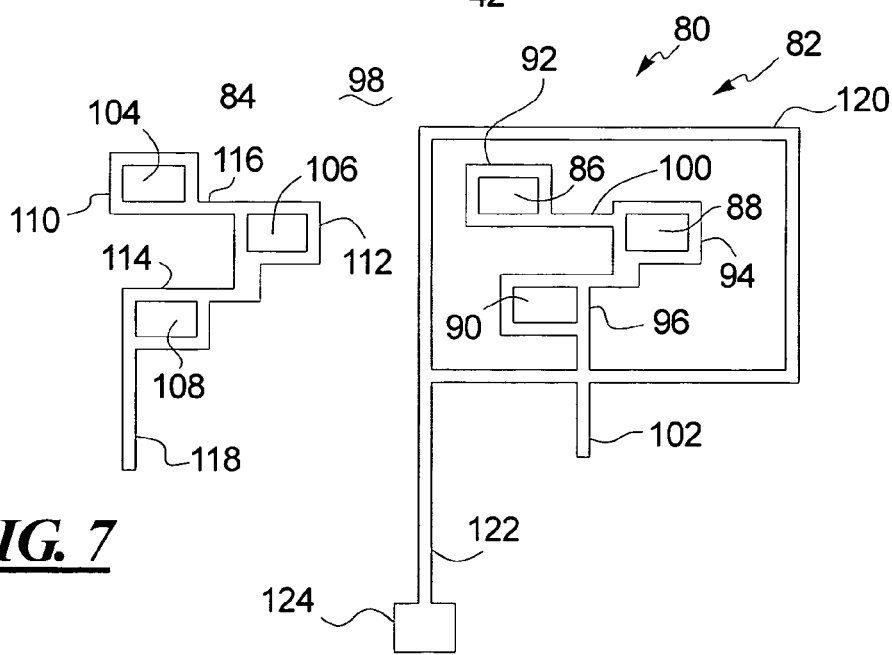

FIG. 7 is a top view of an exemplary layout of an integrated circuit 80. The integrated circuit 80 has two sub-circuits 82 and 84, although the integrated circuit 80 may have additional sub-circuits (not shown). The sub-circuit 82, for example, may be a low noise amplifier and the sub-circuit 84, for example, may be a voltage controlled oscillator.

The sub-circuit 82 includes one or more device mesas such as the device mesas 86, 88, and 90. The device mesa 86 is surrounded by an isolation guard ring 92, the device mesa 88 is surrounded by an isolation guard ring 94, and the device mesa 90 is surrounded by an isolation guard ring 96. The isolation guard rings 92, 94, and 96 may be arranged as shown in FIGS. 1-6 such that they contact corresponding doped areas of a semiconductor substrate 98 over which the integrated circuit 80 is formed. A chip metal 100 of the integrated circuit 80 couples the isolation guard rings 92, 94, and 96 together and to a ground lead 102.

The sub-circuit 84 includes one or more device mesas such as the device mesas 104, 106, and 108. The device mesa 104 is surrounded by an isolation guard ring 110, the device mesa 106 is surrounded by an isolation guard ring 112, and the device mesa 108 is surrounded by an isolation guard ring 114. The isolation guard rings 110, 112, and 114 also may be arranged as shown in FIGS. 1-6 such that they contact corresponding doped areas of the semiconductor substrate 98 over which the integrated circuit 80 is formed. A chip metal 116 of the integrated circuit 80 couples the isolation guard rings 110, 112, and 114 together and to a ground lead 118.

The isolation guard rings 92, 94, and 96 may be considered to be a first isolation guard ring, and the isolation guard rings 110, 112, and 114 may be considered to be a second isolation guard ring. As seen in FIG. 7, the integrated circuit 80 includes a third isolation guard ring 120 that surrounds the sub-circuit 82 and that isolates the sub-circuit 82 from the sub-circuit 84. The third isolation guard ring 120 may be arranged as shown in FIGS. 1-6 such that its contacts a corresponding doped area of the semiconductor substrate 98 over which the integrated circuit 80 is formed. A chip metal 122 of the integrated circuit 80 couples the third isolation guard ring 120 to a bond pad 124 that may be coupled to an off-chip ground.

Certain modifications of the present invention have been discussed above. Other modifications will occur to those practicing in the art of the present invention. For example, as described above, the silicon handle wafer 40 may be a p⁻ silicon handle wafer, and the layer 44 may be an n⁻ layer 44. However, other conductivity types may instead be used for these layers.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. An integrated circuit comprising:
   a semiconductor substrate;
   a buried insulation layer directly over the semiconductor substrate;
   a first semiconductor mesa over the buried insulation layer;
   a first guard ring substantially surrounding the first semiconductor mesa, wherein the first guard ring extends through the buried insulation layer contacting the semiconductor substrate, and wherein the first guard ring is arranged to provide RF isolation for the first semiconductor mesa;
   a second guard ring substantially surrounding the second semiconductor mesa, wherein the second guard ring extends through the buried insulation layer contacting the semiconductor substrate, and wherein the second guard ring is arranged to provide RF isolation for the second semiconductor mesa; and,
   a third guard ring between the first and second guard rings, wherein the third guard ring is in contact with the semiconductor substrate, and wherein the third guard ring is arranged to provide further RF isolation for the first and second semiconductor mesas.

2. The integrated circuit of claim 1 wherein the semiconductor substrate comprises a high resistivity semiconductor substrate.

3. The integrated circuit of claim 1 wherein the semiconductor substrate comprises a silicon substrate, wherein the buried insulating layer comprises a buried silicon oxide layer, and wherein the first semiconductor mesa comprises a silicon mesa, and wherein the second semiconductor mesa comprises a silicon mesa.

4. The integrated circuit of claim 3 wherein the silicon substrate comprises a high resistivity silicon substrate.

5. The integrated circuit of claim 1 wherein the semiconductor substrate is doped in an area that is contacted by the first guard ring, and wherein the semiconductor substrate is doped in an area that is contacted by the second guard ring.

6. The integrated circuit of claim 5 wherein the semiconductor substrate comprises a high resistivity semiconductor substrate.

7. The integrated circuit of claim 5 wherein the semiconductor substrate comprises a silicon substrate, wherein the buried insulating layer comprises a buried silicon oxide layer, wherein the first semiconductor mesa comprises a silicon mesa, and wherein the second semiconductor mesa comprises a silicon mesa.

8. The integrated circuit of claim 7 wherein the silicon substrate comprises a high resistivity silicon substrate.

9. The integrated circuit of claim 1 further comprising:
a first insulating ring between the first guard ring and the first semiconductor mesa, wherein the first insulating ring surrounds the first semiconductor mesa; and
a second insulating ring between the second guard ring and the second semiconductor mesa, wherein the second insulating ring surrounds the second semiconductor mesa.

10. The integrated circuit of claim 9 wherein the semiconductor substrate comprises a high resistivity semiconductor substrate.

11. The integrated circuit of claim 9 wherein the semiconductor substrate comprises a silicon substrate, wherein the buried insulating layer comprises a buried silicon oxide layer, wherein the first insulating ring comprises a silicon oxide insulating ring, wherein the second insulating ring comprises a silicon oxide insulating ring, wherein the first semiconductor mesa comprises a silicon mesa, and wherein the second semiconductor mesa comprises a silicon mesa.

12. The integrated circuit of claim 11 wherein the silicon substrate comprises a high resistivity silicon substrate.

13. The integrated circuit of claim 9 wherein the semiconductor substrate is doped in an area that is contacted by the first guard ring, and wherein the semiconductor substrate is doped in an area that is contacted by the second guard ring.

14. The integrated circuit of claim 13 wherein the semiconductor substrate comprises a high resistivity semiconductor substrate.

15. The integrated circuit of claim 13 wherein the semiconductor substrate comprises a silicon substrate, wherein the buried insulating layer comprises a buried silicon oxide layer, wherein the first insulating ring comprises a silicon oxide insulating ring, wherein the second insulating ring comprises a silicon oxide ring, wherein the first semiconductor mesa comprises a silicon mesa, and wherein the second semiconductor mesa comprises a silicon mesa.

16. The integrated circuit of claim 15 wherein the silicon substrate comprises a high resistivity silicon substrate.

17. The integrated circuit of claim 1 wherein the first guard ring comprises a low resistivity guard ring, and wherein the second guard ring comprises a low resistivity guard ring.

18. The integrated circuit of claim 1 wherein the first guard ring comprises a metal guard ring, and wherein the second guard ring comprises a metal guard ring.

19. The integrated circuit of claim 18 wherein the first and second metal guard rings comprise tungsten guard rings.

20. The integrated circuit of claim 1, wherein the third guard ring is a low resistivity guard ring.

21. The integrated circuit of claim 1, wherein the first semiconductor mesa is one of a first group of semiconductor mesas, wherein the first guard ring is one of a first group of guard rings that individually surrounds each semiconductor mesa in the group of semiconductor mesas, and wherein the third guard ring surrounds the first group of guard rings.

* * * * *